(12) United States Patent
Byun et al.

(10) Patent No.: US 11,166,375 B2
(45) Date of Patent: Nov. 2, 2021

(54) COMPOSITE ELECTRONIC COMPONENT AND BOARD HAVING THE SAME

(71) Applicant: SAMSUNG ELECTRO-MECHANICS CO., LTD., Suwon-si (KR)

(72) Inventors: Man Su Byun, Suwon-si (KR); Ho Yoon Kim, Suwon-si (KR); Kyung Hwa Yu, Suwon-si (KR); Dae Heon Jeong, Suwon-si (KR); Min Kyoung Cheon, Suwon-si (KR); Soo Hwan Son, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/691,787

(22) Filed: Nov. 22, 2019

(65) Prior Publication Data

US 2020/0092999 A1     Mar. 19, 2020

Related U.S. Application Data

(63) Continuation of application No. 15/959,993, filed on Apr. 23, 2018, now abandoned.

(30) Foreign Application Priority Data

Aug. 22, 2017 (KR) .......................... 10-2017-0106216

(51) Int. Cl.
*H05K 1/18* (2006.01)
*H01G 4/30* (2006.01)
(Continued)

(52) U.S. Cl.
CPC .............. *H05K 1/181* (2013.01); *H01G 2/06* (2013.01); *H01G 4/002* (2013.01); *H01G 4/232* (2013.01);
(Continued)

(58) Field of Classification Search
CPC ................... H05K 1/111; H05K 1/181; H05K 2201/10015; H05K 2201/10378;
(Continued)

(56) References Cited

U.S. PATENT DOCUMENTS

| 2004/0066589 A1 | 4/2004 | Togashi et al. |
| 2009/0272569 A1 | 11/2009 | Wischnat |

(Continued)

FOREIGN PATENT DOCUMENTS

| CN | 104465088 A | 3/2015 |
| CN | 104995703 A | 10/2015 |

(Continued)

OTHER PUBLICATIONS

Office Action issued in corresponding Korean Application No. 10-2017-0106216 dated May 27, 2019.

(Continued)

*Primary Examiner* — Roshn K Varghese
(74) *Attorney, Agent, or Firm* — Morgan, Lewis & Bockius LLP (57) ABSTRACT

A composite electronic component includes a composite body in which a multilayer ceramic capacitor and a ceramic chip are coupled to each other, the multilayer ceramic capacitor including a first ceramic body in which a plurality of dielectric layers and internal electrodes disposed to face each other with respective dielectric layers interposed therebetween are stacked, and first and second external electrodes disposed on both end portions of the first ceramic body, and the ceramic chip being disposed on a lower portion of the multilayer ceramic capacitor and formed of a ceramic material having substantially no piezoelectric property, wherein a ratio (T/L) of thickness (T) of the ceramic chip to length (L) of the multilayer ceramic capacitor is selected to minimize vibration of the ceramic chip.

12 Claims, 10 Drawing Sheets

(51) Int. Cl.

| | |
|---|---|
| *H01G 4/232* | (2006.01) |
| *H01G 4/002* | (2006.01) |
| *H01G 4/40* | (2006.01) |
| *H01G 2/06* | (2006.01) |
| *H05K 3/30* | (2006.01) |
| *H01G 4/12* | (2006.01) |
| *H05K 1/11* | (2006.01) |
| *H05K 3/34* | (2006.01) |

(52) U.S. Cl.
CPC ............. *H01G 4/30* (2013.01); *H01G 4/40* (2013.01); *H05K 3/301* (2013.01); *H01G 4/1227* (2013.01); *H05K 1/111* (2013.01); *H05K 3/3442* (2013.01); *H05K 2201/049* (2013.01); *H05K 2201/10015* (2013.01); *H05K 2201/10378* (2013.01); *H05K 2201/10636* (2013.01); *H05K 2201/2045* (2013.01)

(58) Field of Classification Search
CPC . H05K 2201/10636; H05K 2201/2045; H05K 3/301; H05K 3/3442; H05K 2201/049; H01G 4/002; H01G 4/232; H01G 4/30; H01G 4/1227; H01G 2/06; H01G 2/065; H01G 4/012; Y02P 70/50
See application file for complete search history.

(56) References Cited

U.S. PATENT DOCUMENTS

| | | |
|---|---|---|
| 2011/0228443 A1 | 9/2011 | Nishimura et al. |
| 2013/0329388 A1 | 12/2013 | Dogauchi |
| 2014/0041914 A1 | 2/2014 | Hattori et al. |
| 2014/0268486 A1 | 9/2014 | Hattori et al. |
| 2014/0268487 A1 | 9/2014 | Yoshida |
| 2014/0284089 A1 | 9/2014 | Hattori et al. |
| 2015/0026973 A1 | 1/2015 | Ogawa et al. |
| 2015/0083477 A1 | 3/2015 | Lee et al. |
| 2015/0103465 A1 | 4/2015 | Kang et al. |
| 2015/0122534 A1 | 5/2015 | Park et al. |
| 2016/0007446 A1 | 1/2016 | Ishikawa et al. |
| 2016/0093439 A1 | 3/2016 | Fujita et al. |
| 2016/0133386 A1 | 5/2016 | Park et al. |
| 2016/0240510 A1 | 8/2016 | Lien et al. |

FOREIGN PATENT DOCUMENTS

| | | |
|---|---|---|
| JP | 2004-134430 A | 4/2004 |
| JP | 2009-283490 A | 12/2009 |
| JP | 2010-161172 A | 7/2010 |
| JP | 2014-179512 A | 9/2014 |
| JP | 2014-207422 A | 10/2014 |
| KR | 10-2016-0055424 A | 5/2016 |
| KR | 10-2016-0101665 A | 8/2016 |

OTHER PUBLICATIONS

Office Action issued in corresponding Korean Application No. 10-2017-0106216 dated Aug. 28, 2019.

Final Office Action issued in corresponding U.S. Appl. No. 15/959,993 dated Aug. 20, 2019.

Non-Final Office Action issued in corresponding U.S. Appl. No. 15/959,993 dated May 3, 2019.

Office Action issued in corresponding Chinese Patent Application No. 201810735148.8 dated Mar. 5, 2020, with English translation.

Final Office Action issued in corresponding U.S. Appl. No. 16/858,444 dated Nov. 17, 2020.

Office Action issued in corresponding U.S. Appl. No. 16/856,444 dated Mar. 22, 2021.

COMPOSITE ELECTRONIC COMPONENT AND BOARD HAVING THE SAME

CROSS-REFERENCE TO RELATED APPLICATION(S)

This application is the continuation application of U.S. patent application Ser. No. 15/959,993 filed on Apr. 23, 2018, which claims the benefit of priority to Korean Patent Application No. 10-2017-0106216 filed on Aug. 22, 2017 in the Korean Intellectual Property Office, the disclosures of which are incorporated herein by reference in its entirety.

TECHNICAL FIELD

The present disclosure relates to a composite electronic component and a board having the same.

BACKGROUND

A multilayer ceramic capacitor, a multilayer electronic component, is a chip type condenser mounted on the circuit boards of various electronic products, such as display devices, including liquid crystal displays (LCDs), plasma display panels (PDPs), or the like, computers, personal digital assistants (PDAs), mobile phones, and the like, to serve to charge electricity or discharge electricity.

This multilayer ceramic capacitor (MLCC) may be used as a component in various electronic apparatuses due to advantages such as a small size, high capacitance, and ease of mountability.

The multilayer ceramic capacitor may have a structure in which a plurality of dielectric layers and internal electrodes disposed between the dielectric layers and having different polarities are alternately stacked.

Since the dielectric layer as described above has piezoelectricity and electrostriction, when a direct current (DC) or alternating current (AC) voltage is applied to the multilayer ceramic capacitor, a piezoelectric phenomenon may occur between the internal electrodes, thereby generating vibrations.

These vibrations are transferred to a circuit board on which the multilayer ceramic capacitor is mounted through external electrodes of the multilayer ceramic capacitor, such that an entire circuit board becomes a sound reflecting surface to transmit the sound of vibrations as noise.

The sound of vibrations may correspond to an audio frequency range of 20 to 20,000 Hz potentially causing user discomfort. The vibration noise causing listener discomfort as described above is called acoustic noise.

In accordance with the recent trend toward slimness and miniaturization of electronic devices, the multilayer ceramic capacitor has been used together with a printed circuit board in an environment of high voltage and large voltage change, and thus, the acoustic noise may be sufficiently recognized by a user.

Therefore, a novel product capable of decreasing acoustic noise has been continuously demanded.

Meanwhile, research into a composite electronic component in which a printed circuit board was used below a multilayer ceramic capacitor in order to decrease acoustic noise has been conducted.

However, specific research into a degree of removal of acoustic noise depending on a size and a mounting method of the multilayer ceramic capacitor and a thickness of a ceramic chip disposed on a lower portion of the multilayer ceramic capacitor has not been sufficiently conducted.

SUMMARY

An aspect of the present disclosure may provide a composite electronic component capable of decreasing acoustic noise, a board having the same.

According to an aspect of the present disclosure, a composite electronic component may include a composite body in which a multilayer ceramic capacitor and a ceramic chip are coupled to each other, the multilayer ceramic capacitor including a first ceramic body in which a plurality of dielectric layers and internal electrodes disposed to face each other with respective dielectric layers interposed therebetween are stacked, and first and second external electrodes disposed on both end portions of the first ceramic body, and the ceramic chip being disposed on a lower portion of the multilayer ceramic capacitor and formed of a ceramic material containing alumina ($Al_2O_3$), wherein $T/L \geq 0.22$ in which L is a length L of the multilayer ceramic capacitor and T is a thickness of the ceramic chip.

According to another aspect of the present disclosure, a board having a composite electronic component may include: a printed circuit board on which a plurality of electrode pads are formed; the composite electronic component as described above, mounted on the printed circuit board; and a solder connecting the electrode pads and the composite electronic component to each other.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings. In the accompanying drawings, shapes, sizes, and the like, of components may be exaggerated or stylized for clarity.

The present disclosure may, however, be exemplified in many different forms and should not be construed as being limited to the specific embodiments set forth herein. Rather these embodiments are provided so that this disclosure will be thorough and complete, and will fully convey the scope of the disclosure to those skilled in the art.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the accompanying drawings. For example, a first connection member is disposed on a level above a redistribution layer. However, the claims are not limited thereto. In addition, a vertical direction refers to the above-mentioned upward and downward directions, and a horizontal direction refers to a direction perpendicular to the above-mentioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Composite Electronic Component

Figure 1:
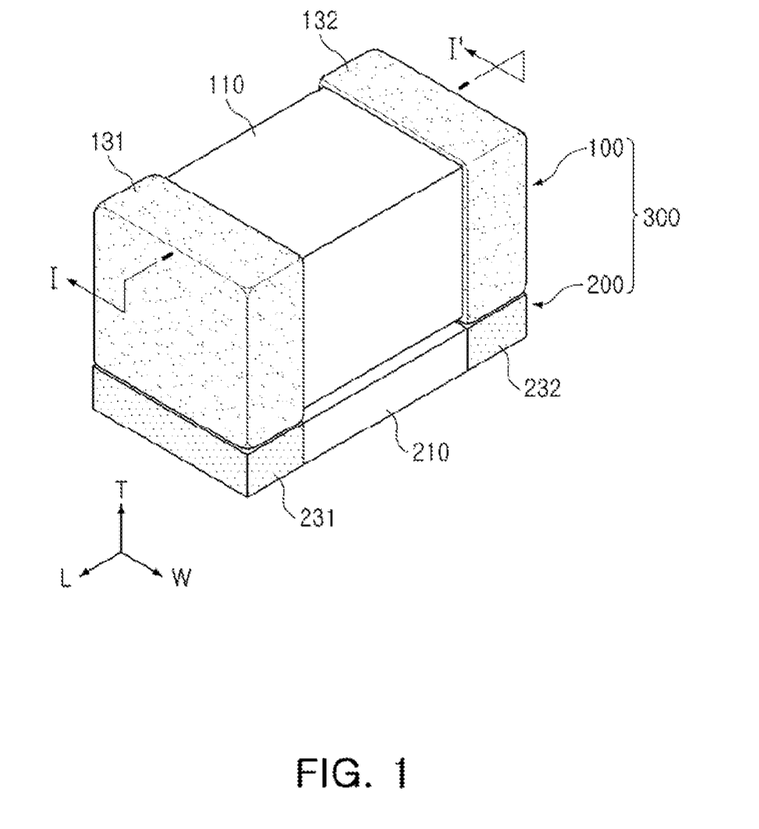
FIG. 1 is a perspective view schematically illustrating a composite electronic component according to a first exemplary embodiment in the present disclosure.

FIG. 1 is a perspective view schematically illustrating a composite electronic component according to a first exemplary embodiment in the present disclosure.

Figure 2:
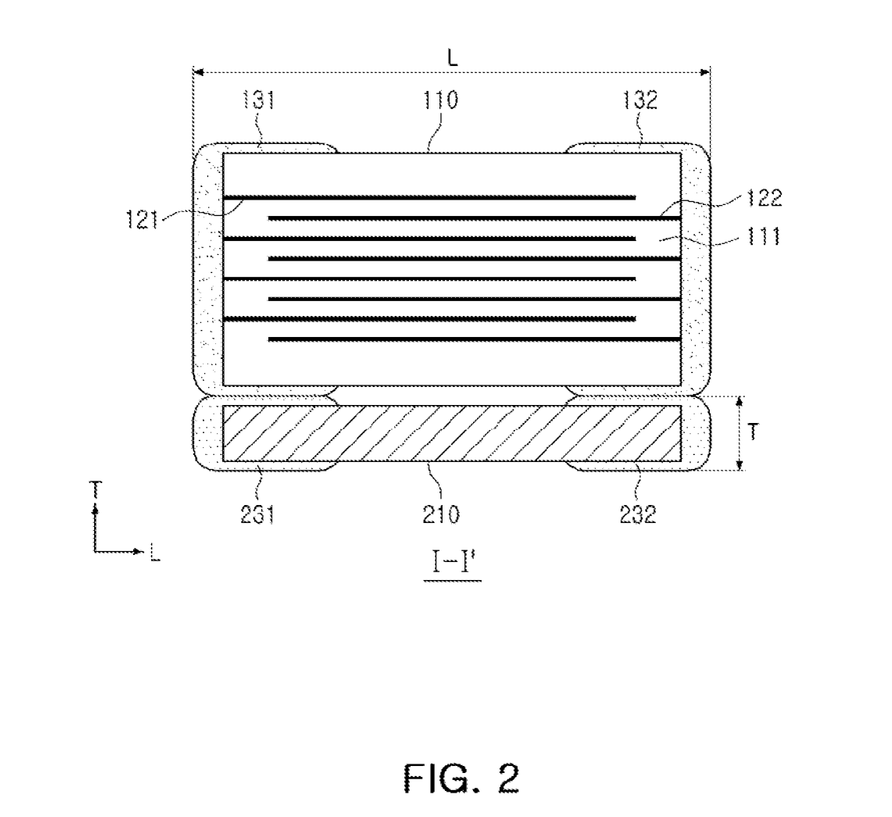
FIG. 2 is a cross-sectional view taken along line I-I' of FIG. 1.

FIG. 2 is a cross-sectional view taken along line I-I' of FIG. 1.

Referring to FIG. 1, in the composite electronic component according to the exemplary embodiment in the present disclosure, a 'length direction' refers to an 'L' direction of FIG. 1, a 'width direction' refers to a 'W' direction of FIG. 1, and a 'thickness direction' refers to a 'T' direction of FIG. 1. Here, the 'thickness direction' may be the same as a direction in which dielectric layers of a capacitor are stacked, that is, a 'stacking direction'.

Meanwhile, in the exemplary embodiment in the present disclosure, the composite electronic component may have upper and lower surfaces opposing each other, first and second end surfaces in the length direction and third and fourth side surfaces in the width direction that connect the upper and lower surfaces to each other. A shape of the composite electronic component is not particularly limited, but may be a hexahedral shape as illustrated.

Meanwhile, in the composite electronic component, a multilayer ceramic capacitor and a ceramic chip may be coupled to each other, and in a case in which the ceramic chip is coupled to a lower portion of the multilayer ceramic capacitor, the upper surface of the composite electronic component may be defined as an upper surface of the multilayer ceramic capacitor, and a lower surface of the composite electronic component may be defined as a lower surface of the ceramic chip.

In addition, the first and second end surfaces of the composite electronic component in the length direction and the third and fourth side surfaces thereof in the width direction may be defined as surfaces in the same directions as directions of first and second end surfaces of the multilayer ceramic capacitor and the ceramic chip in the length direction and third and fourth side surfaces of the multilayer ceramic capacitor and the ceramic chip in the width direction, respectively, as described below.

Referring to FIGS. 1 and 2, the composite electronic component according to the first exemplary embodiment in the present disclosure may include a composite body 300 in which a multilayer ceramic capacitor 100 and a ceramic chip 200 are coupled to each other, wherein the multilayer ceramic capacitor 100 includes a first ceramic body 110 in which a plurality of dielectric layers and internal electrodes 121 and 122 disposed to face each other with respective dielectric layers interposed therebetween are stacked, and first and second external electrodes 131 and 132 disposed on both end portions of the first ceramic body 110, and the ceramic chip 200 is disposed on a lower portion of the multilayer ceramic capacitor 100 and formed of a ceramic material containing, for example, alumina ($Al_2O_3$).

According to the exemplary embodiment in the present disclosure, the ceramic chip 200 may include a second ceramic body 210 formed of the ceramic material containing, for example, alumina ($Al_2O_3$) and first and second terminal electrodes 211 and 212 disposed on both end portions of the second ceramic body 210 and connected to first and second external electrodes 131 and 132, respectively.

The ceramic material may contain alumina ($Al_2O_3$).

In general, in order to significantly decrease the transferring of vibration of a multilayer ceramic capacitor to a printed circuit board, there have been attempts to insert an intermediate medium between the multilayer ceramic capacitor and the printed circuit board.

However, since the intermediate medium is formed of a material having elasticity as a resin generally used to manufacture a printed circuit board, the intermediate medium may serve to absorb vibrations of the multilayer ceramic capacitor through elasticity of the intermediate medium.

On the contrary, according to the first exemplary embodiment in the present disclosure, since the second ceramic body 210 of the ceramic chip 200 is formed of a hard ceramic material, for example, containing alumina ($Al_2O_3$) that is not elastically deformed, the printed circuit board and the multilayer ceramic capacitor 100 may be spaced apart from each other by the ceramic chip 200, thereby blocking vibration generated in the multilayer ceramic capacitor 100 from being transferred to the board.

According to the exemplary embodiment in the present disclosure, a length L of the multilayer ceramic capacitor 100 and a thickness T of the ceramic chip 200 may satisfy T/L≥0.22.

According to the related art, research into a composite electronic component in which a printed circuit board was used on a lower surface of a multilayer ceramic capacitor in order to decrease acoustic noise has been conducted. However, specific research into a degree of removal of acoustic noise depending on a size and a mounting method of the multilayer ceramic capacitor and a thickness of a ceramic chip disposed on a lower portion of the multilayer ceramic capacitor has not been sufficiently conducted. Therefore, research for finding the critical point with respect to an influence of acoustic noise depending on the size and the mounting method of the multilayer ceramic capacitor, and the thickness of the ceramic chip disposed on the lower portion of the multilayer ceramic capacitor has been required. According to the exemplary embodiment in the present disclosure, a numerical value for the critical point as described above may be provided.

More specifically, in the exemplary embodiment in the present disclosure, a thickness of the ceramic chip 200 at which acoustic noise is significantly decreased may be provided depending on the size of the multilayer ceramic capacitor 100 by adjusting the length L of the multilayer ceramic capacitor 100 and the thickness T of the ceramic chip 200 so as to satisfy T/L≥0.22.

That is, the influence of acoustic noise generated in the multilayer ceramic capacitor 100 may be significantly decreased by adjusting the length L of the multilayer ceramic capacitor 100 and the thickness T of the ceramic chip 200 so as to satisfy T/L≥0.22.

When the ratio (T/L) of the thickness T of the ceramic chip 200 to the length L of the multilayer ceramic capacitor 100 is less than 0.22, an effect of decreasing acoustic noise may be insufficient. Further, even though the ratio is constant, the effect of decreasing acoustic noise may be insufficient depending on a mounting method of the ceramic chip 200.

In the exemplary embodiment in the present disclosure, the length of the multilayer ceramic capacitor 100 may be 2.0 mm or more.

That is, in the composite electronic component according to the exemplary embodiment in the present disclosure, the multilayer ceramic capacitor may be applied to a product having a length of at least 2.0 mm or more rather than a miniaturized component.

For example, in the exemplary embodiment in the present disclosure, the multilayer ceramic capacitor 100 may have a 2012 size (length×width: 2.0 mm×1.2 mm), or a 3216 size (length×width: 3.2 mm×1.6 mm) or more.

A composite electronic component in which a ceramic chip was disposed on a lower portion of a multilayer ceramic capacitor in order to decrease acoustic noise, the multilayer ceramic capacitor had a size equal to or smaller than a 1608 size (length×width: 1.6 mm×0.8 mm), for example, a 1005 size (length×width: 1.0 mm×0.5 mm) or less has been attempted.

According to the exemplary embodiment in the present disclosure, in a case of the multilayer ceramic capacitor that does not have a small size but has a length of at least 2.0 mm or more, a range of the thickness of the ceramic chip with respect to the length of the multilayer ceramic capacitor in which acoustic noise is significantly decreased may be provided.

The thickness of the ceramic chip 200 may be 0.5 mm or more. That is, according to the exemplary embodiment in the present disclosure, in a case in which the length of the multilayer ceramic capacitor 100 is at least 2.0 mm or more, only when the thickness of the ceramic chip 200 at which acoustic noise is significantly decreased is at least 0.5 mm or more, the effect of the present disclosure may be implemented. However, the thickness of the ceramic chip is not necessarily limited thereto.

On the contrary, when the thickness of the ceramic chip 200 is less than 0.5 mm, the effect of decreasing acoustic noise may be insufficient.

Hereinafter, the multilayer ceramic capacitor 100 and the ceramic chip 200 configuring the composite body 300 will be described in detail.

Referring to FIG. 2, the first ceramic body 110 configuring the multilayer ceramic capacitor 100 may be formed by stacking the plurality of dielectric layers 111, and a plurality of internal electrodes 121 and 122 (sequential first and second internal electrodes) may be disposed in the first ceramic body 110 to be separated from each other with respective dielectric layers 111 interposed therebetween.

The plurality of dielectric layers 111 configuring the first ceramic body 110 may be in a sintered state, and adjacent dielectric layers 111 may be integrated with each other so that boundaries therebetween may not be readily apparent.

The dielectric layer 111 may be formed by sintering a ceramic green sheet containing a ceramic powder, an organic solvent, and an organic binder. The ceramic powder, which is a material having high permittivity, may be a barium titanate ($BaTiO_3$) based material, a strontium titanate ($SrTiO_3$) based material, or the like, but is not limited thereto.

That is, the dielectric layer 111 configuring the first ceramic body 110 may contain a ferroelectric material, but is not necessarily limited thereto.

Meanwhile, according to the first exemplary embodiment in the present disclosure, the internal electrodes may include first internal electrodes 121 exposed to the first end surface of the composite body 300 in the length direction and second internal electrodes 122 exposed to the second end surface thereof in the length direction, but the internal electrodes are not necessarily limited thereto.

The first and second internal electrodes 121 and 122 may be formed of a conductive paste containing a conductive metal.

The conductive metal may be nickel (Ni), copper (Cu), palladium (Pd), or alloys thereof, but is not limited thereto.

The first and second internal electrodes 121 and 122 may be printed on the ceramic green sheets forming the dielectric layers 111, using the conductive paste by a printing method such as screen printing method or a gravure printing method.

The first ceramic body 110 may be formed by alternately stacking and sintering the ceramic green sheets on which the internal electrode is printed.

The plurality of first and second internal electrodes 121 and 122 may be disposed to be horizontal to the upper and lower surfaces of the first ceramic body 110.

Meanwhile, the first and second external electrodes 131 and 132 may be formed of a conductive paste including a conductive metal, wherein the conductive metal may be nickel (Ni), copper (Cu), palladium (Pd), gold (Au), or alloys thereof, but is not limited thereto.

Further, nickel/tin (Ni/Sn) plating layers may be further disposed on the first and second external electrodes 131 and 132.

In the exemplary embodiment in the present disclosure, the length of the multilayer ceramic capacitor 100 may be 2.0 mm or more.

That is, in the composite electronic component according to the exemplary embodiment in the present disclosure, the multilayer ceramic capacitor may be applied to the product having a length of at least 2.0 mm or more rather than the miniaturized component.

For example, in the exemplary embodiment in the present disclosure, the multilayer ceramic capacitor 100 may have a 2012 size (length: 2.0 mm×width: 1.2 mm), a 3216 size (length: 3.2 mm×width: 1.6 mm) or more.

According to the first exemplary embodiment in the present disclosure, the ceramic chip 200 may be coupled to the lower portion of the multilayer ceramic capacitor 100 to thereby be disposed thereon.

In the ceramic chip 200, the first and second terminal electrodes 231 and 232 connected to the first and second external electrodes 131 and 132 may be disposed on both end portions of the second ceramic body 210 formed of a bulk shaped ceramic material.

In general, in order to significantly decrease the transferring of vibration of a multilayer ceramic capacitor to a printed circuit board, there was an attempt to insert an intermediate medium between the multilayer ceramic capacitor and the printed circuit board.

However, since the intermediate medium is formed of a material having elasticity, e.g., a resin generally used to manufacture a printed circuit board, the intermediate medium may serve to absorb vibration of the multilayer ceramic capacitor through elasticity of the intermediate medium.

On the contrary, according to the first exemplary embodiment in the present disclosure, since the second ceramic body 210 of the ceramic chip 200 is formed of a hard ceramic material that is not elastically deformed, the printed circuit board and the multilayer ceramic capacitor 100 may be spaced apart from each other by the ceramic chip 200, thereby blocking vibration generated in the multilayer ceramic capacitor 100 from being transferred to the board.

According to the first exemplary embodiment in the present disclosure, the ceramic material having substantially no piezoelectric property. For example, the ceramic material may contain alumina ($Al_2O_3$). As referred to herein, a material having substantially no piezoelectric property means that no measurable deformation is caused in the material when voltages typically applied to capacitors in electronic devices are applied to the material.

Since alumina ($Al_2O_3$) does not have a piezoelectric property, a ceramic chip containing alumina may suppress vibration generated in the multilayer ceramic capacitor 100 from being transferred, such that the ceramic chip 200 containing alumina ($Al_2O_3$) is disposed on the lower portion of the multilayer ceramic capacitor 100 to decrease acoustic noise.

Although not particularly limited, the first and second terminal electrodes 231 and 232 may have, for example, a double layer structure composed of first and second conductive resin layers at inner portions thereof and first and second plating layers at outer portions thereof.

According to the first exemplary embodiment in the present disclosure, since the first and second terminal electrodes 231 and 232 have the double layer structure composed of the first and second conductive resin layers at the inner portions thereof and the first and second plating layers at the outer portions thereof, when mechanical stress is applied thereto from the outside, the ceramic chip 200 and the conductive resin layers used as the terminal electrodes 231 and 232 of the ceramic chip 200 may suppress stress from being transferred to the multilayer ceramic capacitor 100, thereby preventing the multilayer ceramic capacitor from being damaged by cracks.

The first and second conductive resin layers may contain a conductive metal and a thermosetting resin, for example, silver (Ag) and an epoxy resin, but are not limited thereto.

Figure 3:
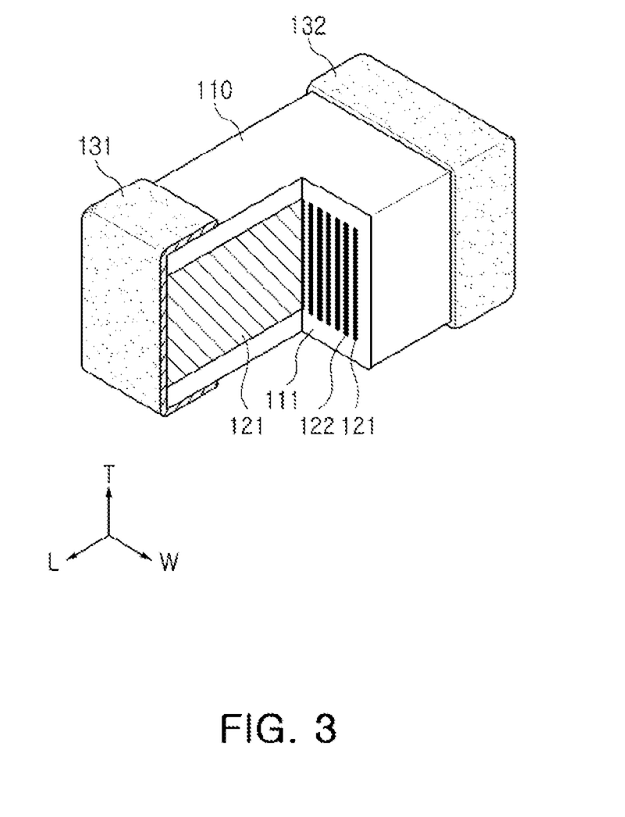
FIG. 3 is a partially cut-away perspective view schematically illustrating a multilayer ceramic capacitor according to a second exemplary embodiment in the present disclosure in the composite electronic component of FIG. 1.

FIG. 3 is a partially cut-away perspective view schematically illustrating a multilayer ceramic capacitor according to a second exemplary embodiment in the present disclosure in the composite electronic component of FIG. 1.

In the multilayer ceramic capacitor according to the second exemplary embodiment in the present disclosure, a plurality of first and second internal electrodes 121 and 122 may be disposed to be perpendicular to upper and lower surfaces of a first ceramic body 110.

That is, the first and second internal electrodes 121 and 122 may be stacked to be perpendicular to amounting surface of the composite body 300 at the time of mounting the composite body 300 on a printed circuit board.

In general, when a voltage is applied to a multilayer ceramic capacitor, a ceramic body may be repeatedly expanded and contracted in length, width, and thickness directions due to an inverse piezoelectric effect of dielectric layers.

That is, in a case of actually measuring displacement amounts of a surface (LW surface) of the ceramic body in a length-width direction, a surface (WT surface) of the ceramic body in a width-thickness direction, and a surface (LT surface) of the ceramic body in a length-thickness direction using a laser doppler vibrometer (LDV), the displacement amount is decreased in a sequence of the LW surface, the WT surface, and the LT surface.

The displacement amount of the LT surface is about 42% or so, based on that of the WT surface, such that the displacement amount of the LT surface may be smaller than that of the WT surface. The reason may be that stress having the same magnitude is generated in the LT surface and the WT surface, but particularly, since the LT surface has a relatively wide area as compared to the WT surface, stress having a similar magnitude may be distributed throughout the wide area, such that relatively small deformation may occur.

Therefore, it may be appreciated that in the general multilayer ceramic capacitor, the displacement amount is the smallest in the LT surface.

That is, according to the exemplary embodiment in the present disclosure, the first and second internal electrodes 121 and 122 may be stacked to be perpendicular to the upper and lower surfaces of the first ceramic body 110, such that at the time of mounting the composite body 300 on the printed circuit board, the first and second internal electrodes 121 and 122 may be disposed to be perpendicular to the mounting surface, thereby significantly decreasing a vibration amount of a surface of the first ceramic body 110 coming in contact with the ceramic chip 200.

Figure 4:
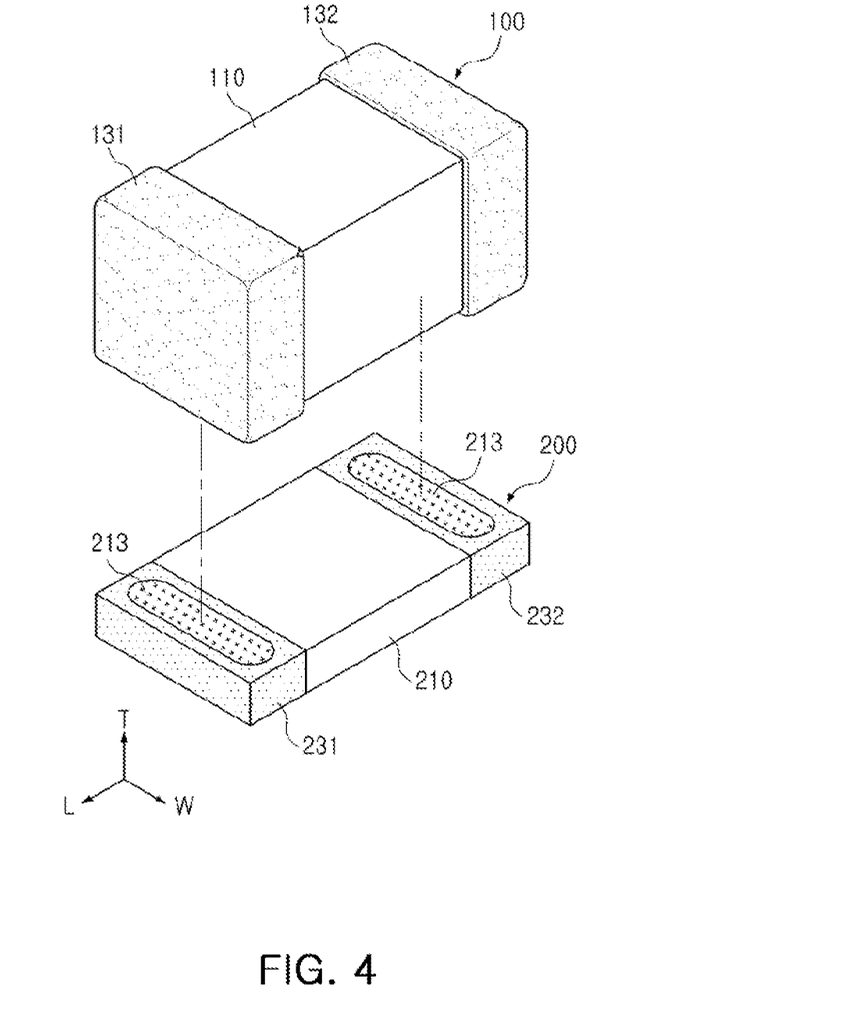
FIG. 4 is an exploded perspective view separately illustrating a multilayer ceramic capacitor and a ceramic chip of the composite electronic component of FIG. 1.

FIG. 4 is an exploded perspective view separately illustrating a multilayer ceramic capacitor and a ceramic chip of the composite electronic component of FIG. 1.

The composite body 300 may be formed by coupling the multilayer ceramic capacitor 100 and the ceramic chip 200 to each other, and a method of forming the composite body 300 is not particularly limited.

The composite body 300 may be formed by coupling the multilayer ceramic capacitor 100 and the ceramic chip 200 that are separately manufactured to each other using a high-melting point solder, a conductive adhesive 213, or the like.

The conductive adhesive 213 may be a paste containing a conductive metal and an epoxy resin, but is not necessarily limited thereto.

Referring to FIG. 4, in a case of coupling the multilayer ceramic capacitor 100 and the ceramic chip 200 using the high-melting point solder, the conductive adhesive 213, or the like, the conductive paste 213 may be applied onto the lower surfaces of the first and second external electrodes 131 and 132 to thereby be adhered to the first and second terminal electrodes 231 and 232 of the ceramic chip 200.

The high-melting point solder or the conductive adhesive 213 may be applied onto the lower surfaces of the first and second external electrodes 131 and 132 to thereby be fixed to the ceramic chip 200 at the lower surface of the multilayer ceramic capacitor 100, such that only vibration of the surface (LW surface) of the first ceramic body 110 in the length-width direction may be transferred to the ceramic chip 200.

Therefore, the transferring of stress and vibration generated in the multilayer ceramic capacitor to the ceramic chip may be significantly decreased, such that acoustic noise may be decreased.

Figure 5:
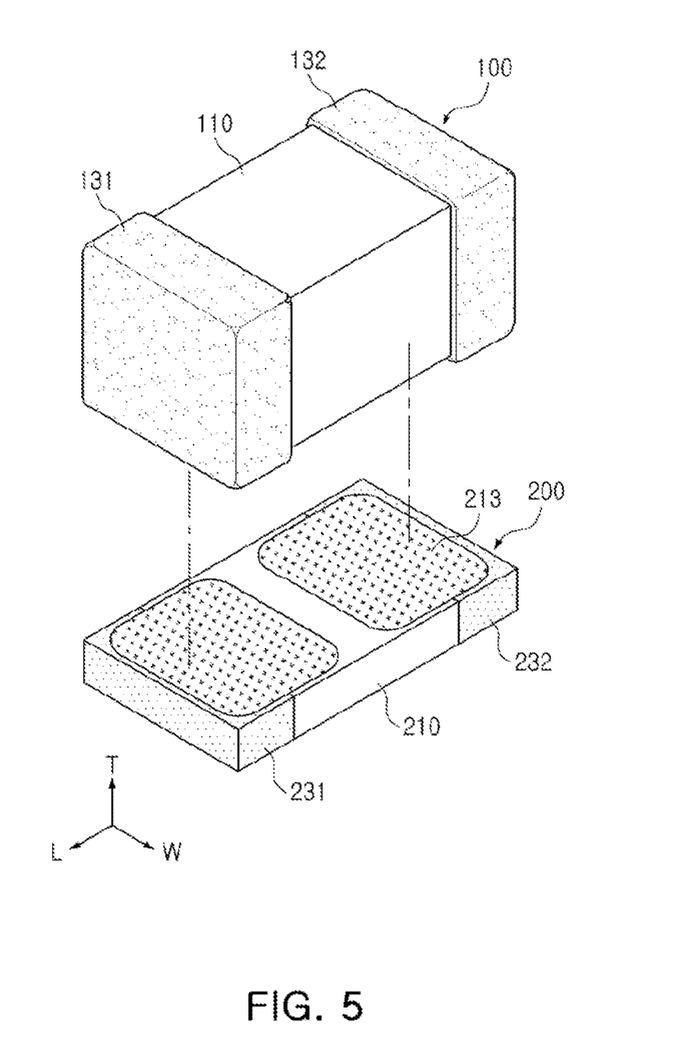
FIG. 5 is an exploded perspective view separately illustrating a multilayer ceramic capacitor and a ceramic chip of another example of the composite electronic component of FIG. 1.

FIG. 5 is an exploded perspective view separately illustrating a multilayer ceramic capacitor and a ceramic chip of another example of the composite electronic component of FIG. 1.

Referring to FIG. 5, the high-melting point solder or the conductive adhesive 213 may be applied to a portion of the upper surface of the ceramic chip 200, an adhesion surface of the ceramic chip 200 adhered to the multilayer ceramic capacitor 100, to thereby be fixed to the ceramic chip 200 at the lower surface of the multilayer ceramic capacitor 100.

In a case in which the conductive adhesive 213 is applied to the entire upper surface of the ceramic chip 200, the adhesion surface of the ceramic chip 200 adhered to the multilayer ceramic capacitor 100, as described above, the effect of decreasing acoustic noise may be improved due to elasticity of the conductive adhesive 213.

Further, since the adhesive is applied to the entire adhesion surface, at the time of mounting the composite electronic component in a board, binding strength of the composite electronic component may be improved, such that reliability may be improved.

Figure 6:
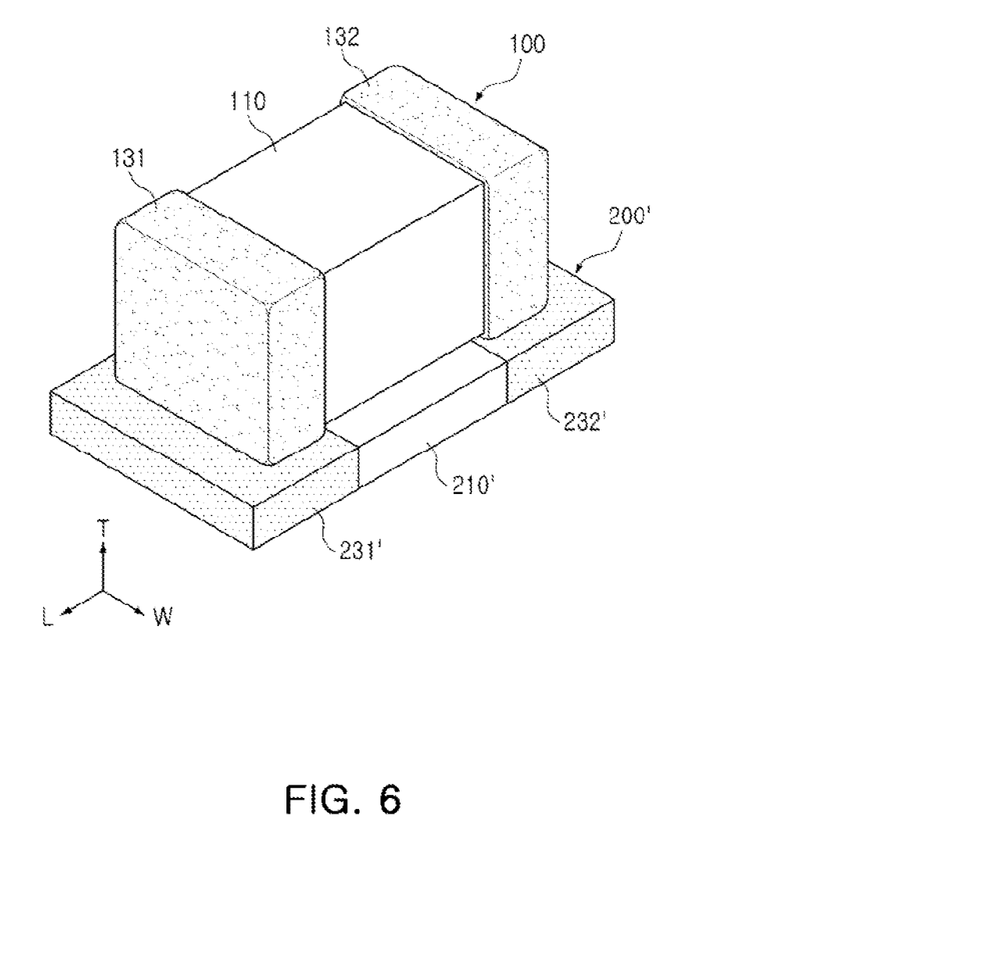
FIG. 6 is a perspective view schematically illustrating a composite electronic component according to a third exemplary embodiment of the present disclosure.

FIG. 6 is a perspective view schematically illustrating a composite electronic component according to a third exemplary embodiment of the present disclosure.

Referring to FIG. 6, in the composite electronic component according to the third exemplary embodiment in the present disclosure, a length of a ceramic chip 200' may be longer than that of a multilayer ceramic capacitor 100, and a width of the ceramic chip 200' may be wider than that of the multilayer ceramic capacitor 100.

The ceramic chip 200' may include a second ceramic body 210' formed of a ceramic material and first and second terminal electrodes 231' and 232' disposed on both end portions of the second ceramic body 210' and connected to first and second external electrodes 131 and 132.

Since the length of the ceramic chip 200' is longer than that of the multilayer ceramic capacitor 100, and the width of the ceramic chip 200' is wider than that of the multilayer ceramic capacitor 100, at the time of mounting the composite electronic component on a printed circuit board, the ceramic chip 200' may serve to block a solder from being connected up to the multilayer ceramic capacitor 100 in length and width directions of the multilayer ceramic capacitor 100.

Therefore, the transferring of vibration to the printed circuit board by the solder may be further decreased.

Figure 7:
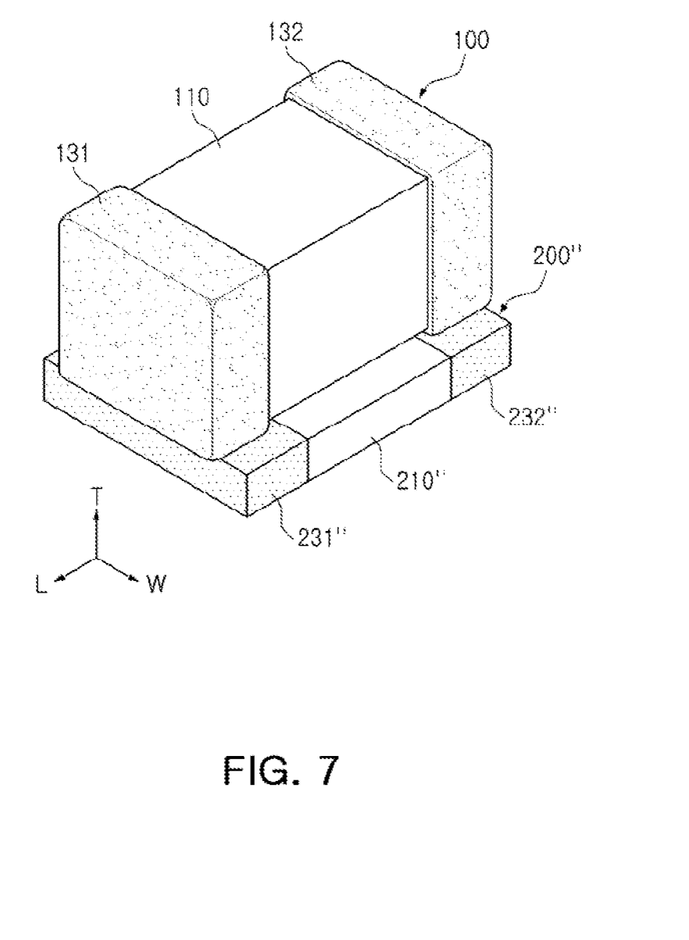
FIG. 7 is a perspective view schematically illustrating a composite electronic component according to a fourth exemplary embodiment in the present disclosure.

FIG. 7 is a perspective view schematically illustrating a composite electronic component according to a fourth exemplary embodiment in the present disclosure.

Referring to FIG. 7, in the composite electronic component according to the fourth exemplary embodiment in the present disclosure, a length of a ceramic chip 200" may be shorter than that of a multilayer ceramic capacitor 100, and a width of the ceramic chip 200" may be wider than that of the multilayer ceramic capacitor 100.

The ceramic chip 200" may include a second ceramic body 210" formed of a ceramic material and first and second terminal electrodes 231" and 232" disposed on both end portions of the second ceramic body 210" and connected to first and second external electrodes 131 and 132.

Since the length of the ceramic chip 200" is shorter than that of the multilayer ceramic capacitor 100, and the width of the ceramic chip 200" is wider than that of the multilayer ceramic capacitor 100, at the time of mounting the composite electronic component on a printed circuit board, the ceramic chip 200" may serve to allow solder to be applied only up to lower surfaces of the first and second external electrodes 131 and 132 in a length direction of the multilayer ceramic capacitor 100 and block the solder from being connected up to the multilayer ceramic capacitor 100 due to a step in a width direction thereof.

That is, since the length of the second ceramic chip 200" is shorter than that of the multilayer ceramic capacitor 100, a so-called solder pocket blocking the solder from rising up to the first and second external electrodes 131 and 132 in the length direction of the multilayer ceramic capacitor 100 may be formed.

In this structure, at the time of mounting the composite electronic component on a printed circuit board, the solder may only be applied up to the lower surfaces of the first and second external electrodes 131 and 132 in the length direction of the multilayer ceramic capacitor 100.

Therefore, the transferring of vibration to the printed circuit board by the solder may be further decreased.

Figure 8:
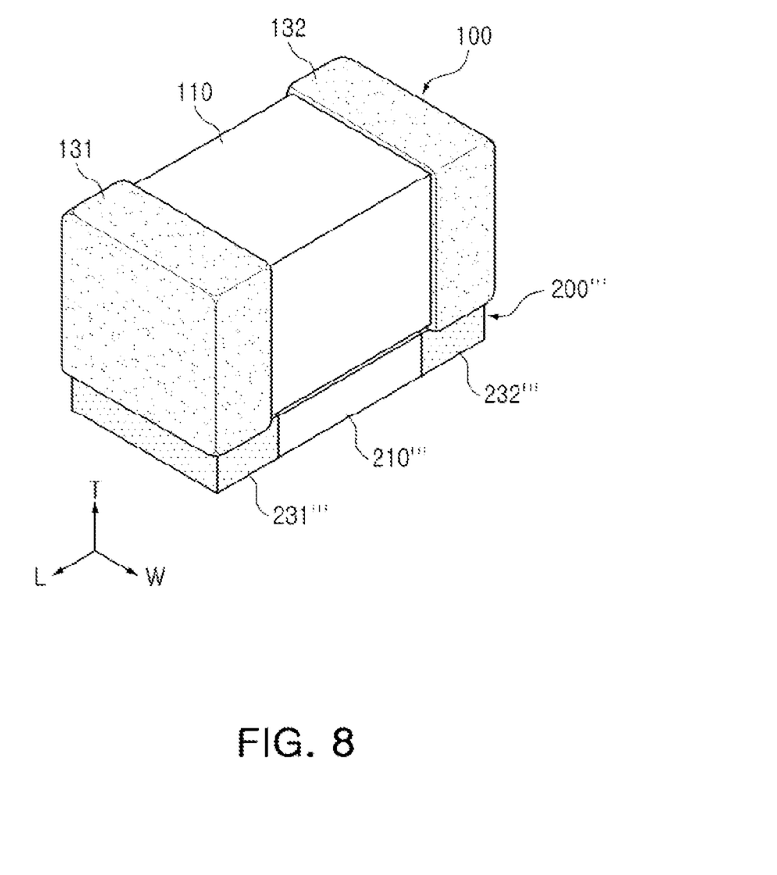
FIG. 8 is a perspective view schematically illustrating a composite electronic component according to a fifth exemplary embodiment in the present disclosure.

FIG. 8 is a perspective view schematically illustrating a composite electronic component according to a fifth exemplary embodiment in the present disclosure.

Referring to FIG. 8, in the composite electronic component according to the fifth exemplary embodiment in the present disclosure, a length of a ceramic chip 200''' may be shorter than that of a multilayer ceramic capacitor 100, and a width of the ceramic chip 200''' may be narrower than that of the multilayer ceramic capacitor 100.

The ceramic chip 200''' may include a second ceramic body 210''' formed of a ceramic material and first and second terminal electrodes 231''' and 232''' disposed on both end portions of the second ceramic body 210''' and connected to first and second external electrodes 131 and 132.

Since the length of the ceramic chip 200''' is shorter than that of the multilayer ceramic capacitor 100, and the width of the ceramic chip 200''' is narrower than that of the multilayer ceramic capacitor 100, at the time of mounting the composite electronic component on a printed circuit board, the ceramic chip 200''' may serve to allow the solder to be applied only up to lower surfaces of the first and second external electrodes 131 and 132 in length and width directions of the multilayer ceramic capacitor 100, and block the solder from being connected up to the multilayer ceramic capacitor 100 in a thickness direction thereof.

Therefore, the transferring of vibration to the printed circuit board by the solder may be further decreased.

Board Having Composite Electronic Component

Figure 9:
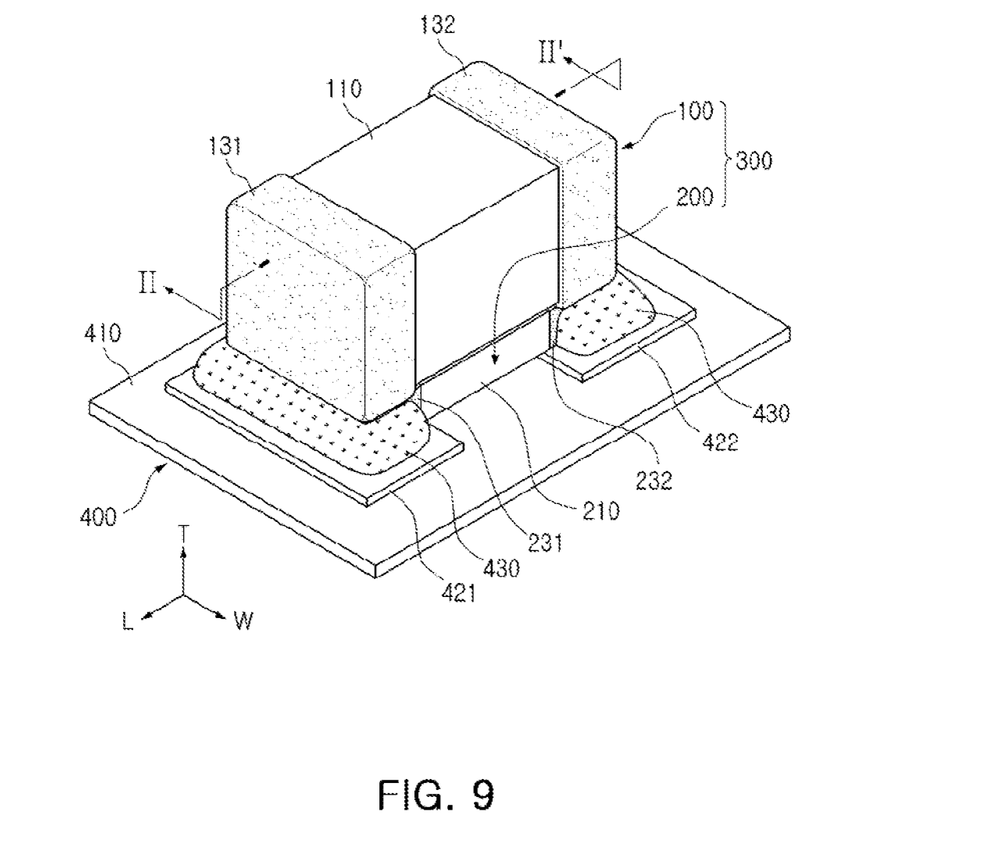
FIG. 9 is a perspective view illustrating a board in which the composite electronic component of FIG. 1 is mounted on a printed circuit boar.

FIG. 9 is a perspective view illustrating a board in which the composite electronic component of FIG. 1 is mounted on a printed circuit boar.

Figure 10:
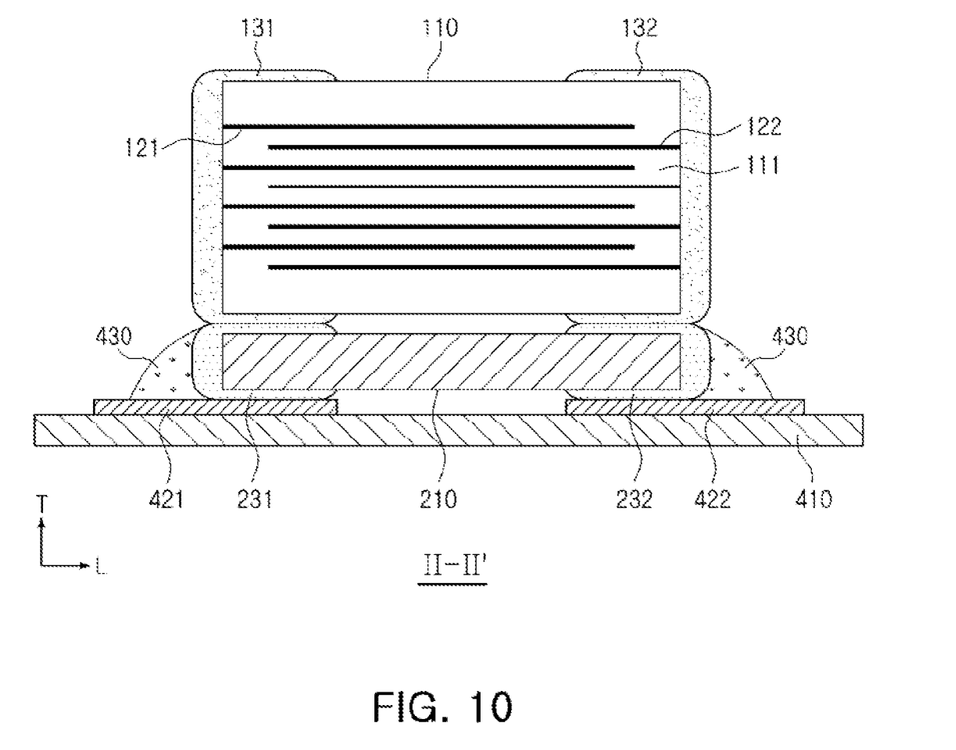
FIG. 10 is a cross-sectional view taken along line II-II' of FIG. 9.

FIG. 10 is a cross-sectional view taken along line II-II' of FIG. 9.

Referring to FIGS. 9 and 10, a board 400 having a composite electronic component according to the present exemplary embodiment may include a printed circuit board 410 and two electrode pads 421 and 422 formed on an upper surface of the printed circuit board 410.

The electrode pads 421 and 422 may be composed of first and second electrode pads 421 and 422 connected to the first and second terminal electrodes 231 and 232 of the ceramic chip 200 of the composite electronic component, respectively.

In this case, the first and second terminal electrodes 231 and 232 of the ceramic chip 200 may be electrically connected to the printed circuit board 410 by solder 430 in a state in which first and second terminal electrodes 231 and 232 are positioned to contact the first and second electrode pads 421 and 422, respectively.

When a voltage is applied in a state in which the composite electronic component is mounted on the printed circuit board 410 as described above, acoustic noise may be generated.

That is, when voltages having different polarities are applied to the first and second external electrodes 131 and 132 disposed on both end surfaces of the multilayer ceramic capacitor 100 of the composite electronic component in the length direction in a state in which the composite electronic component is mounted on the printed circuit board 410, the first ceramic body may be expanded and contracted in the thickness direction by an inverse piezoelectric effect of the dielectric layer 111, and both side portions of the first and second external electrodes 131 and 132 may be contracted and expanded by a Poisson effect as opposed to expansion and contraction of the first ceramic body 110 in the thickness direction.

Here, in the composite electronic component according to the exemplary embodiment in the present disclosure, the ceramic chip 200 may be disposed on the lower portion of the multilayer ceramic capacitor 100, such that at the time of mounting the composite electronic component on the printed circuit board, a problem that the solder rises up to the first and second external electrodes 131 and 132 of the multilayer ceramic capacitor 100 may be prevented, thereby blocking piezoelectric stress from being directly transferred from the multilayer ceramic capacitor 100 to the printed circuit board through the first and second external electrodes 131 and 132. Therefore, acoustic noise may be further decreased.

That is, at the time of mounting the composite electronic component on the printed circuit board, the transferring of vibrations of the capacitor due to the inverse piezoelectric property of the capacitor to the printed circuit board may be decreased, such that acoustic noise may be decreased.

Hereafter, although the present disclosure will be described in detail with reference to Inventive Examples, the present disclosure is not limited thereto.

Experimental Example

Composite electronic components according to Inventive Examples and Comparative Examples were manufactured as follows.

In Inventive Examples and Comparative Examples according to the present disclosure, a ceramic chip was disposed on a lower portion of a multilayer ceramic capacitor, and a composite electronic component was manufactured depending on a length of the multilayer ceramic capacitor and a mounting form of internal electrodes. Acoustic noise levels depending on a ratio (T/L) of a thickness T of a second ceramic chip 200 to a length L of the multilayer ceramic capacitor 100 was compared.

More specifically, the following [Table 1] illustrates results obtained by comparing acoustic noise levels when the length of the multilayer ceramic capacitor was 2.078 mm and the internal electrodes were stacked to be horizontal to a mounting surface of a printed circuit board.

In Comparative Examples 1 to 4 and Inventive Examples 1 to 3, each 5 samples were manufactured and tested, and an average value obtained by testing acoustic noise levels in each 5 samples was represented as the acoustic noise level.

TABLE 1

|  | Thickness (mm) of Ceramic Chip | T/L | Acoustic Noise (dBA) |
|---|---|---|---|
| Comparative Example 1 | 0.25 | 0.12 | 41.56 |
| Comparative Example 2 | 0.3 | 0.14 | 40.86 |
| Comparative Example 3 | 0.35 | 0.17 | 42.48 |
| Comparative Example 4 | 0.4 | 0.19 | 41.40 |
| Inventive Example 1 | 0.45 | 0.22 | 37.00 |
| Inventive Example 2 | 0.5 | 0.24 | 36.56 |
| Inventive Example 3 | 0.65 | 0.31 | 36.44 |

Referring to Table 1, in Comparative Examples 1 to 4 in which the ratio (T/L) of the thickness T of the second ceramic chip 200 to the length L of the multilayer ceramic capacitor 100 was less than 0.22, the acoustic noise level was measured to be 41.40 dBA or more.

On the contrary, In Inventive Examples 1 to 3 in which the ratio (T/L) of the thickness T of the second ceramic chip 200 to the length L of the multilayer ceramic capacitor 100 was 0.22 or more, the acoustic noise level was measured to be 37.00 dBA or less. Therefore, it may be appreciated that the acoustic noise level was decreased.

The following [Table 2] illustrates results obtained by comparing acoustic noise levels when the length of the multilayer ceramic capacitor was 2.078 mm and the internal electrodes were stacked to be perpendicular to a mounting surface of a printed circuit board.

In Comparative Examples 1 to 2 and Inventive Examples 1 to 3, each 5 samples were manufactured and tested, and an average value obtained by testing acoustic noise levels in each 5 samples was represented as the acoustic noise level.

TABLE 2

|  | Thickness (mm) of Ceramic Chip | T/L | Acoustic Noise (dBA) |
|---|---|---|---|
| Comparative Example 1 | 0.25 | 0.12 | 37.25 |
| Comparative Example 2 | 0.4 | 0.19 | 35.90 |
| Inventive Example 1 | 0.45 | 0.22 | 31.26 |

TABLE 2-continued

|  | Thickness (mm) of Ceramic Chip | T/L | Acoustic Noise (dBA) |
|---|---|---|---|
| Inventive Example 2 | 0.5 | 0.24 | 28.74 |
| Inventive Example 3 | 0.65 | 0.31 | 28.62 |

Referring to Table 2, it may be appreciated that the acoustic noise levels were low as compared to those in Table 1. That is, it may be appreciated that according to the exemplary embodiment in the present disclosure, in a structure in which the internal electrodes disposed in the multilayer ceramic capacitor were stacked to be perpendicular to the mounting surface of the printed circuit board, the effect of decreasing acoustic noise was more excellent as compared to a structure in which the internal electrodes were stacked to be horizontal thereto.

In Comparative Examples 1 and 2 in which the ratio (T/L) of the thickness T of the second ceramic chip 200 to the length L of the multilayer ceramic capacitor 100 was less than 0.22, the acoustic noise level was measured to be 35.90 dBA or more.

On the contrary, In Inventive Examples 1 to 3 in which the ratio (T/L) of the thickness T of the second ceramic chip 200 to the length L of the multilayer ceramic capacitor 100 was 0.22 or more, the acoustic noise level was measured to be 31.26 dBA or less. Therefore, it may be appreciated that the acoustic noise level was decreased.

The following [Table 3] illustrates results obtained by comparing acoustic noise levels when the length of the multilayer ceramic capacitor was 3.346 mm and the internal electrodes were stacked to be horizontal to amounting surface of a printed circuit board.

In Comparative Examples 1 to 3 and Inventive Examples 1 and 2, each 5 samples were manufactured and tested, and an average value obtained by testing acoustic noise levels in each 5 samples was represented as the acoustic noise level.

TABLE 3

|  | Thickness (mm) of Ceramic Chip | T/L | Acoustic Noise (dBA) |
|---|---|---|---|
| Comparative Example 1 | 0.25 | 0.07 | 43.12 |
| Comparative Example 2 | 0.45 | 0.13 | 41.32 |
| Comparative Example 3 | 0.6 | 0.18 | 42.04 |
| Inventive Example 1 | 0.75 | 0.22 | 35.42 |
| Inventive Example 2 | 0.9 | 0.27 | 33.74 |

Referring to Table 3, in Comparative Examples 1 to 3 in which the ratio (T/L) of the thickness T of the second ceramic chip 200 to the length L of the multilayer ceramic capacitor 100 was less than 0.22, the acoustic noise level was measured to be 42.04 dBA or more.

On the contrary, In Inventive Examples 1 and 2 in which the ratio (T/L) of the thickness T of the second ceramic chip 200 to the length L of the multilayer ceramic capacitor 100 was 0.22 or more, the acoustic noise level was measured to be 35.42 dBA or less. Therefore, it may be appreciated that the acoustic noise level was decreased.

As set forth above, according to exemplary embodiments in the present disclosure, stress or vibrations due to the piezoelectric property of the multilayer ceramic capacitor may be alleviated by the ceramic chip, such that the acoustic noise generated in the printed circuit board may be decreased.

Particularly, the effect of decreasing acoustic noise may be significantly increased by optimizing the ratio of the size of the multilayer ceramic capacitor and the thickness of the ceramic chip.

Further, the internal electrodes of the multilayer ceramic capacitor may be stacked perpendicularly to the mounting surface of the composite body, and the surface of the first ceramic body in the length-width direction of which a piezoelectric displacement amount is small may be adhered to the ceramic chip, such that the transferring of stress and vibration generated in the multilayer ceramic capacitor to the ceramic chip may be significantly decreased, thereby decreasing acoustic noise.

While exemplary embodiments have been shown and described above, it will be apparent to those skilled in the art that modifications and variations could be made without departing from the scope of the present invention as defined by the appended claims.

What is claimed is:

1. A composite electronic component comprising a composite body in which a multilayer ceramic capacitor and a ceramic chip are coupled to each other,
   the multilayer ceramic capacitor including a first ceramic body in which a plurality of dielectric layers and internal electrodes disposed to face each other with respective dielectric layers interposed therebetween are stacked, and first and second external electrodes respectively disposed on both end portions of the first ceramic body, and
   the ceramic chip being disposed on a lower portion of the multilayer ceramic capacitor and including a ceramic material containing alumina ($Al_2O_3$),
   wherein the ceramic chip has an upper surface on which the multilayer ceramic capacitor is disposed and a lower surface opposing the upper surface, the upper surface and the lower surface of the ceramic chip being connected to end surfaces of the ceramic chip which oppose each other in a length direction of the ceramic chip, the upper surface and the lower surface of the ceramic chip being also connected to side surfaces of the ceramic chip which oppose each other in a width direction of the ceramic chip,
   wherein $T/L \geq 0.22$, L is 2.0 mm or more, and T is 0.9 mm or less and 0.45 mm or more, in which L is a length L of the multilayer ceramic capacitor and T is a thickness of the ceramic chip,
   wherein in the length direction, a length of the ceramic chip is longer than that of the multilayer ceramic capacitor, and
   wherein the ceramic chip includes a first terminal electrode disposed only on the upper surface, the lower surface, one of the end surfaces, and the side surfaces of the ceramic chip and connected to the first external electrode, and a second terminal electrode disposed only on the upper surface, the lower surface, the other of the end surfaces, and the side surfaces of the ceramic chip and connected to the second external electrode.

2. The composite electronic component of claim 1, wherein the multilayer ceramic capacitor and the ceramic chip are coupled to each other by a conductive adhesive applied to an entire adhesion surface of the ceramic chip.

3. A composite electronic component comprising a composite body in which a multilayer ceramic capacitor and a ceramic chip are coupled to each other, the multilayer ceramic capacitor including a first ceramic body in which a plurality of dielectric layers and internal electrodes disposed to face each other with respective dielectric layers interposed therebetween are stacked, and first and second external electrodes disposed on both end portions of the first ceramic body containing alumina ($Al_2O_3$), and the ceramic chip being disposed on a lower surface of the multilayer ceramic capacitor and including a second ceramic body formed of a ceramic material containing alumina ($Al_2O_3$), wherein the internal electrodes are stacked to be perpendicular to the lower surface of the multilayer ceramic capacitor, wherein the ceramic chip has an upper surface on which the multilayer ceramic capacitor is disposed and a lower surface opposing the upper surface, the upper surface and the lower surface of the ceramic chip being connected to end surfaces of the ceramic chip which oppose each other in a length direction of the ceramic chip, the upper surface and the lower surface of the ceramic chip being also connected to side surfaces of the ceramic chip which oppose each other in a width direction of the ceramic chip, wherein $T/L \geq 0.12$, L is 2.0 mm or more, and T is 0.9 mm or less and 0.45 mm or more, in which L is a length L of the multilayer ceramic capacitor and T is a thickness of the ceramic chip, wherein in the length direction, a length of the ceramic chip is longer than that of the multilayer ceramic capacitor, and wherein the ceramic chip includes a first terminal electrode disposed only on the upper surface, the lower surface, one of the end surfaces, and the side surfaces of the ceramic chip and connected to the first external electrode, and a second terminal electrode disposed only on the upper surface, the lower surface, the other of the end surfaces, and the side surfaces of the ceramic chip and connected to the second external electrode.

4. The composite electronic component of claim 1, wherein each of the end surfaces extends continuously between the side surfaces.

5. A composite electronic component comprising a composite body in which a multilayer ceramic capacitor and a ceramic chip are coupled to each other, the multilayer ceramic capacitor including a first ceramic body in which a plurality of dielectric layers and internal electrodes disposed to face each other with respective dielectric layers interposed therebetween are stacked, and first and second external electrodes disposed on both end portions of the first ceramic body, and the ceramic chip being disposed on a lower portion of the multilayer ceramic capacitor and formed of a ceramic material containing alumina ($Al_2O_3$), wherein the ceramic chip has an upper surface on which the multilayer ceramic capacitor is disposed and a lower surface opposing the upper surface, the upper surface and the lower surface of the ceramic chip being connected to end surfaces of the ceramic chip which oppose each other in a length direction of the ceramic chip, the upper surface and the lower surface of the ceramic chip being also connected to side surfaces of the ceramic chip which oppose each other in a width direction of the ceramic chip, wherein $T/L \geq 0.22$, L is 2.0 mm or more, and T is 0.9 mm or less and 0.45 mm or more, in which L is a length L of the multilayer ceramic capacitor and T is a thickness of the ceramic chip, wherein in the width direction, a width of the ceramic chip is wider than that of the multilayer ceramic capacitor, and wherein the ceramic chip includes a first terminal electrode disposed only on the upper surface, the lower surface, one of the end surfaces, and the side surfaces of the ceramic chip and connected to the first external electrode, and a second terminal electrode disposed only on the upper surface, the lower surface, the other of the end surfaces, and the side surfaces of the ceramic chip and connected to the second external electrode.

6. The composite electronic component of claim 5, wherein the multilayer ceramic capacitor and the ceramic chip are coupled to each other by a conductive adhesive applied to an entire adhesion surface of the ceramic chip.

7. The composite electronic component of claim 5, further comprising a conductive adhesive disposed only on the upper surface of the ceramic chip.

8. The composite electronic component of claim 5, wherein each of the end surfaces extends continuously between the side surfaces.

9. The composite electronic component of claim 1, further comprising a conductive adhesive disposed only on the upper surface of the ceramic chip.

10. The composite electronic component of claim 3, wherein a width of the ceramic chip is wider than that of the multilayer ceramic capacitor.

11. The composite electronic component of claim 3, further comprising a conductive adhesive disposed only on the upper surface of the ceramic chip.

12. The composite electronic component of claim 3, wherein each of the end surfaces extends continuously between the side surfaces.

* * * * *